US010553640B2

(12) United States Patent
Horng et al.

(10) Patent No.: US 10,553,640 B2
(45) Date of Patent: Feb. 4, 2020

(54) ELECTRODELESS LIGHT-EMITTING DIODE DISPLAY AND METHOD FOR FABRICATING THE SAME

(71) Applicant: National Chiao Tung University, Hsinchu (TW)

(72) Inventors: Ray-Hua Horng, Taichung (TW); Huan-Yu Chien, Yilan County (TW); Ken-Yen Chen, Taichung (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 92 days.

(21) Appl. No.: 15/896,453

(22) Filed: Feb. 14, 2018

(65) Prior Publication Data
US 2018/0323235 A1   Nov. 8, 2018

Related U.S. Application Data

(62) Division of application No. 15/654,303, filed on Jul. 19, 2017.

(30) Foreign Application Priority Data

May 4, 2017 (TW) .............................. 106114840 A

(51) Int. Cl.
*H01L 27/15* (2006.01)
*H01L 33/62* (2010.01)
(Continued)

(52) U.S. Cl.
CPC ...... *H01L 27/156* (2013.01); *H01L 23/49811* (2013.01); *H01L 23/49838* (2013.01); *H01L 33/005* (2013.01); *H01L 33/62* (2013.01)

(58) Field of Classification Search
CPC ........... H01L 23/49838; H01L 23/5386; H01L 27/156; H01L 27/153; H01L 33/0079; H01L 33/62
See application file for complete search history.

(56) References Cited

U.S. PATENT DOCUMENTS 6,403,985 B1   6/2002   Kim
7,795,804 B2   9/2010   Kim
(Continued)

FOREIGN PATENT DOCUMENTS

CN   105762166 A   7/2016
CN   106129219 A   11/2016
(Continued)

OTHER PUBLICATIONS

National Intellectual Property Adminstration of the People's Republic of China, Office Action, dated Mar. 25, 2019, 8 pages.
(Continued)

*Primary Examiner* — Zandra V Smith
*Assistant Examiner* — John M Parker
(74) *Attorney, Agent, or Firm* — Muncy, Geissler, Olds & Lowe, P.C.

(57) ABSTRACT

An electrodeless LED display and a method for fabricating the same are disclosed. In the method, an epitaxial layer is provided and a transparent conduction layer is formed on the epitaxial layer to bond a substrate. The epitaxial layer is etched to form dies deposition metal films on the transparent conduction layer. Conduction channels are formed on the substrate, and two ends of each conduction channel are respectively provided two conduction metal blocks. First metal members are formed on the metal film formed on the dies and the conduction metal blocks to connect with the dies on the different conduction channels. Then, second metal members are formed on the first metal members formed on the conduction metal blocks, whereby the second metal members and the first metal members formed on the dies are located on an identical plane.

6 Claims, 12 Drawing Sheets

(51) Int. Cl.
*H01L 33/00* (2010.01)
*H01L 23/498* (2006.01)

(56) References Cited

U.S. PATENT DOCUMENTS

| | | | |
|---|---|---|---|
| 8,642,363 B2 | 2/2014 | Lau et al. | |
| 8,791,474 B1 | 7/2014 | Bibl et al. | |
| 9,159,700 B2 | 10/2015 | Sakariya et al. | |
| 9,343,448 B2 | 5/2016 | Sakariya et al. | |
| 2010/0059733 A1* | 3/2010 | Shei | H01L 27/156 |
| | | | 257/13 |
| 2012/0012889 A1* | 1/2012 | Okabe | H01L 33/405 |
| | | | 257/99 |
| 2012/0235204 A1* | 9/2012 | Hodota | H01L 33/38 |
| | | | 257/98 |
| 2012/0256187 A1* | 10/2012 | Yu | H01L 27/153 |
| | | | 257/76 |
| 2014/0042398 A1* | 2/2014 | Choi | H01L 27/3244 |
| | | | 257/40 |
| 2014/0284632 A1* | 9/2014 | Mao | H01L 33/10 |
| | | | 257/88 |
| 2015/0097808 A1* | 4/2015 | Roh | G06F 3/0412 |
| | | | 345/174 |
| 2017/0062516 A1* | 3/2017 | Peng | H01L 27/156 |
| 2017/0115813 A1* | 4/2017 | Chen | G06F 3/0416 |
| 2018/0373091 A1* | 12/2018 | Nagata | G02F 1/13338 |

FOREIGN PATENT DOCUMENTS

| | | |
|---|---|---|
| CN | 106159057 A | 11/2016 |
| CN | 106486508 A | 3/2017 |
| TW | 201130164 A | 9/2011 |
| WO | WO 2008031280 A1 | 3/2008 |

OTHER PUBLICATIONS

Wing Cheung Chong et al.; "Performance Enhancements of Flip-Chip Light-Emitting Diodes With High-Density n-Type Point-Contacts"; Oct. 2014; pp. 1048-1051; vol. 35, No. 10; IEEE Electron Device Letters.

* cited by examiner

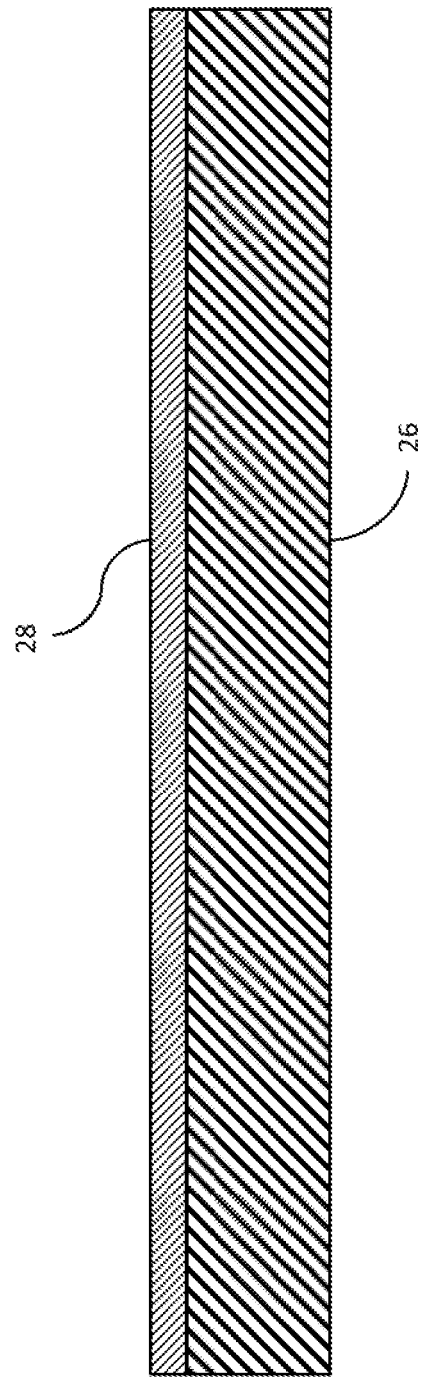

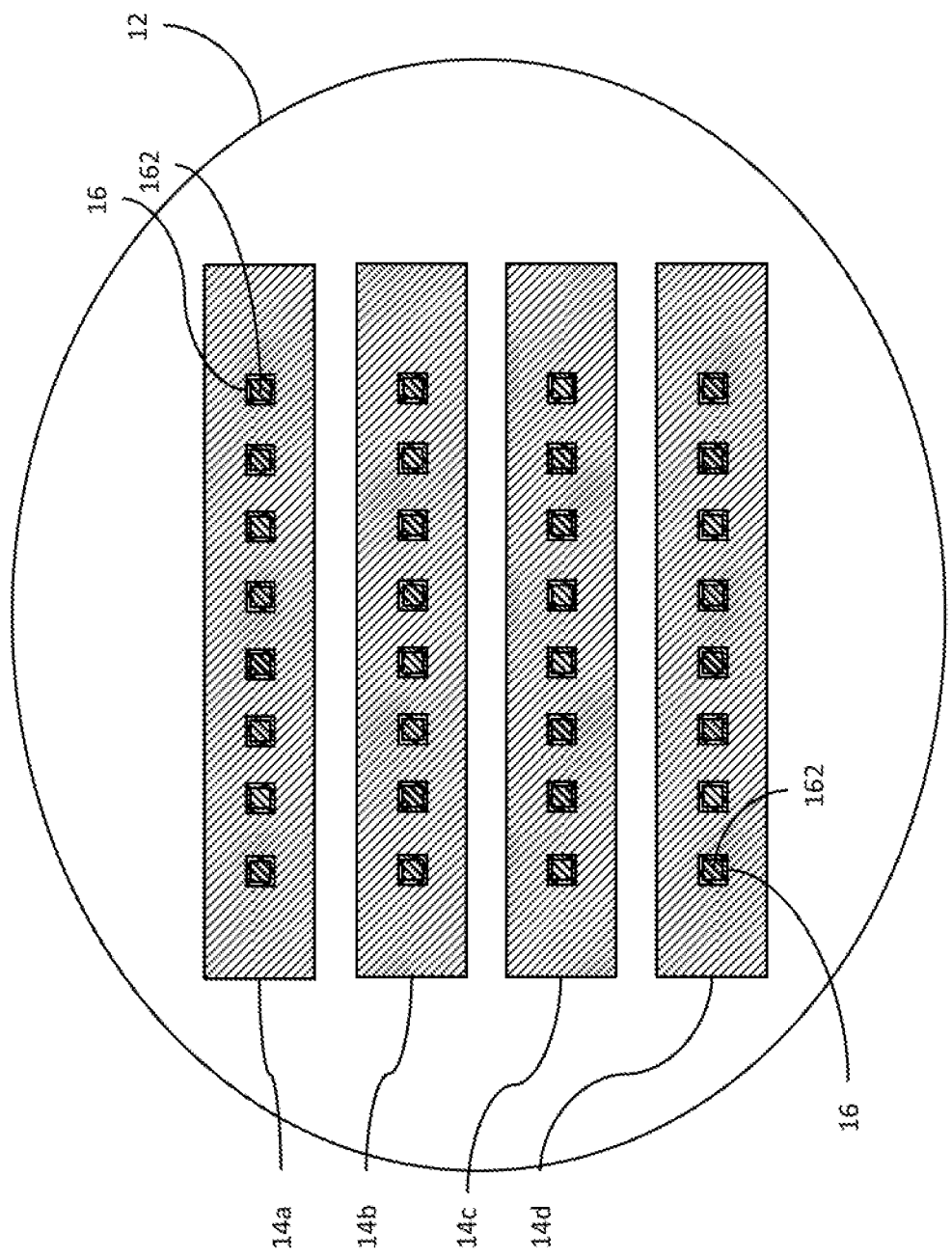

ELECTRODELESS LIGHT-EMITTING DIODE DISPLAY AND METHOD FOR FABRICATING THE SAME

CROSS-REFERENCE TO RELATED APPLICATIONS

This application is a Divisional of co-pending application Ser. No. 15/654,303 filed Jul. 19, 2017, for which priority is claimed under 35 U.S.C. § 120; and this application claims priority of Application No. 106114840 filed in Taiwan on May 4, 2017 under 35 U.S.C. § 119; the entire contents of all of which are hereby incorporated by reference in their entirely.

BACKGROUND OF THE INVENTION

Field of the Invention

The present invention relates to a LED display and a method for fabricating the same, particularly to an electrodeless LED display and a method for fabricating the same.

Description of the Related Art

A lighting principle and a structure of a LED are different from those of a conventional light source. The LEDs feature low power dissipation, long life, and fast lighting response. Since the LEDs have small volumes, they can be massively produced and cooperate with application requirement to fabricate the smallest or arrayed assembly, which is presently popular in the market.

In a conventional LED display, an epitaxial layer is formed on a substrate, and a cathode and an anode are respectively fabricated at two sides of the epitaxial layer and the substrate. Although the LED display has good current distribution, a package area of the LED display is easily increased. Thus, a flip-chip LED display is developed. In the flip-chip LED display, a P-type semiconductor and an N-type semiconductor at a side of an epitaxial layer are exposed, so that a cathode and an anode are fabricated at an identical side of the epitaxial layer. As a result, using flip-chip package, the LED display provided with the cathode and the anode directly covers package solder, whereby the requirement of wire bonding is exempted to improve the reliability of the LED display.

However, when the flip-chip LED display emits light upward, the light is easily absorbed by an upper substrate, whereby the light cannot penetrate the substrate to reach an exterior of the LED display. Accordingly, although the flip-chip LED display has an advantage of package, the intensity of the outputted light is easily reduced. Nowadays, the flip-chip LED display has very large lamination spacing, thereby easily limiting the resolution. The methods for fabricating the other LED displays cannot form a light-emitting surface that no electrode shields light. As a result, most of the present LED displays use backlight modules to have the disadvantages of large volume and low efficiency.

To overcome the above mentioned problems, the present invention provides an electrodeless LED display and a method for fabricating the same, so as to solve the aforementioned problems with large spacing and low brightness.

SUMMARY OF THE INVENTION

A primary objective of the present invention is to provide an electrodeless LED display and a method for fabricating the same, which forms an electrodeless LED array with small spacing, high brightness and high resolution, and the LED display does not require a backlight module but uses a lithography process to define a light-emitting region, and the method can greatly improve the resolution of the LED display without using a pick and place process.

Another objective of the present invention is to provide an electrodeless LED display and a method for fabricating the same, which apply to various instruments that can illuminate, such as wearable devices, display meters of machines, military displays, optical display devices, laser diodes, traffic lights, data storage devices, communication devices, and illumination devices.

To achieve the abovementioned objectives, the present invention provides a method for fabricating an electrodeless LED display, which comprises: providing an epitaxial layer and forming a transparent conduction layer on the epitaxial layer; using the transparent conduction layer to bond a substrate, and the transparent conduction layer is formed between the epitaxial layer and the substrate; etching the epitaxial layer to form a plurality of dies spaced on the transparent conduction layer; depositing a metal film on an upper surface of each die; removing a part of the transparent conduction layer to form a plurality of conduction channels on the substrate, and the dies are arranged on the conduction channels; respectively forming two conduction metal blocks at two ends of each conduction channel; forming a plurality of first metal members on the metal film formed on each die and the conduction metal blocks, and connecting each first metal member with the dies on different the conduction channels; and forming a plurality of second metal members on the first metal members formed on the conduction metal blocks, and the second metal members and the first metal members respectively arranged over the conduction metal blocks and the dies are located on an identical plane.

The present invention provides an electrodeless LED display comprising: a substrate; a plurality of conduction channels spaced on the substrate; a plurality of dies spaced on each conduction channel; a plurality of conduction metal blocks, and every two the conduction metal blocks arranged at two ends of each conduction channel; a plurality of first metal members perpendicular to the conduction channels, and the first metal members arranged on the conduction metal blocks and the dies, and the dies are electrically connected in series through the first metal members; and a plurality of second metal members arranged on the first metal members formed on the conduction metal blocks, and the second metal members and the first metal members respectively arranged over the conduction metal blocks and the dies are located on an identical plane.

In an embodiment of the present invention, the transparent conduction layer is formed on the epitaxial layer via a deposition method, and the transparent conduction layer is bonded to the substrate through glue, and the epitaxial layer is etched by mesa etching, and the part of the transparent conduction layer is removed by etching, so as to form the conduction channels on the substrate.

In an embodiment of the present invention, an area of the metal film on the upper surface of each die is less than an area of the upper surface of each die.

In an embodiment of the present invention, before forming the first metal members on the metal film formed on each die and the conduction metal blocks, the dies and the conduction metal blocks are coated with photoresists, exposed by photomasks and developed to remove unnecessary photoresists, so as to expose the metal film formed on each die and a part of upper surfaces of the conduction metal blocks.

In an embodiment of the present invention, each of the die and the conduction metal block is further provided with a photoresist layer covering a periphery of each of the die and the conduction metal block and uncovering the metal film arranged on the die and a part of an upper surface of the conduction metal block.

Below, the embodiments are described in detail in cooperation with the drawings to make easily understood the technical contents, characteristics and accomplishments of the present invention.

BRIEF DESCRIPTION OF THE DRAWINGS

FIGS. 4a-4i are diagrams schematically showing the steps of fabricating a LED display according to an embodiment of the present invention.

DETAILED DESCRIPTION OF THE INVENTION

The present invention fabricates a LED display with high brightness and high resolution, wherein the LED display has a light-emitting surface that no metal electrode shields light and uses the technology for lamination, lithography and etching to define lighting elements and electrodes without using a pick and place process. A structure of the LED display of the present invention is different from that of a conventional LED display.

Figure 1:
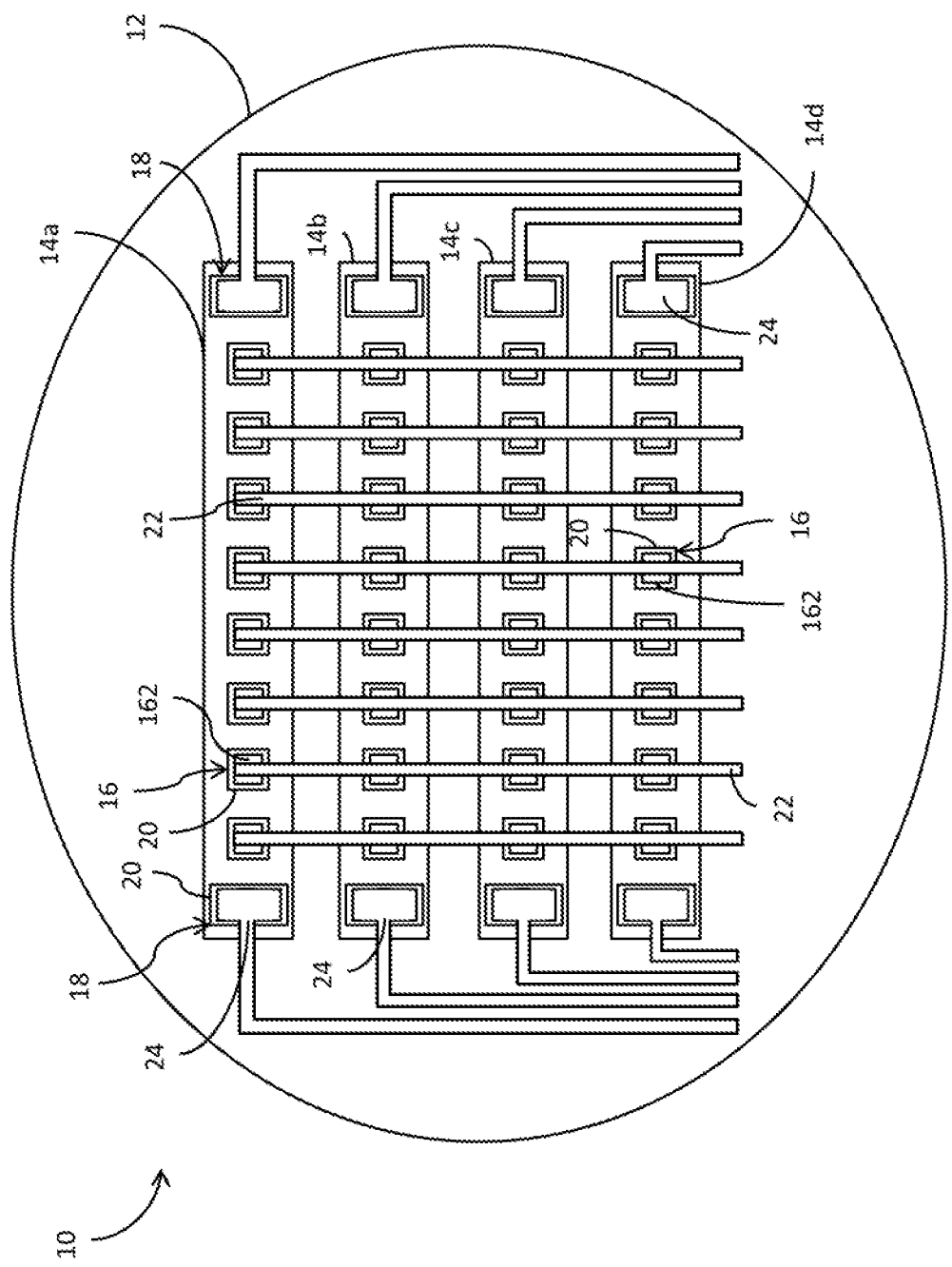
FIG. 1 is a top view of a LED display according to an embodiment of the present invention.
Figure 2:
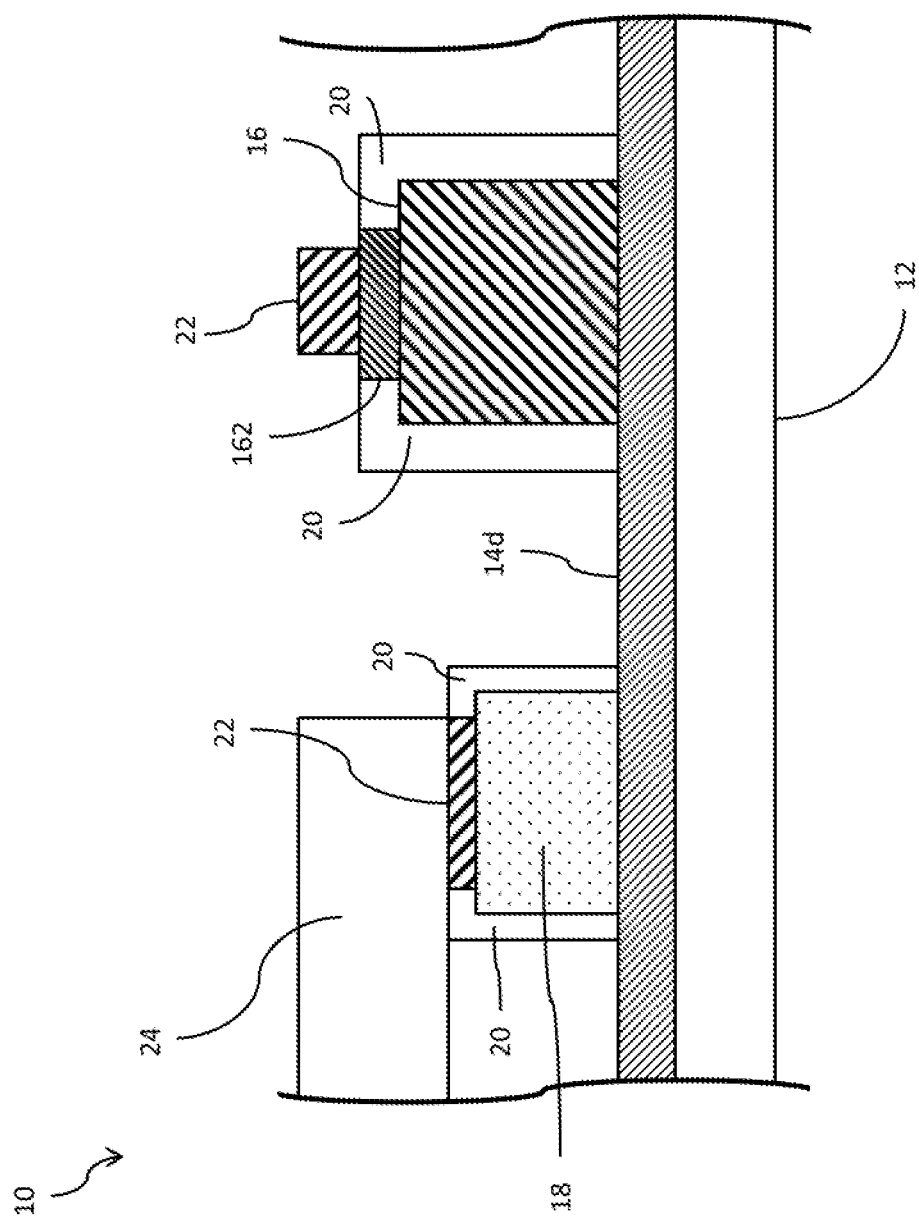
FIG. 2 is a diagram schematically showing a part of a LED display according to one embodiment of the present invention.

Refer to FIG. 1 and FIG. 2 of the present invention. An electrodeless light-emitting diode (LED) display 10 comprises a substrate 12, wherein a plurality of conduction channels 14a, 14b, 14c and 14d is spaced on the substrate 12, but the present invention is not limited thereto. Each conduction channel 14a, 14b, 14c and 14d is provided with a plurality of dies 16 spaced. An upper surface of the die 16 has a metal film 162. Two ends of each conduction channel 14a, 14b, 14c and 14d are respectively provided with two conduction metal blocks 18. A photoresist layer 20 covers a periphery of each of the die 16 and the conduction metal block 18 and uncovers the metal film 162 arranged on the die 16 and a part of an upper surface of the conduction metal block 18. A plurality of first metal members 22 is perpendicular to the conduction channels 14a, 14b, 14c and 14d and arranged on the dies 16 and the conduction metal blocks 18. The first metal members 22 are arranged on the metal films 162 formed on the dies 16, whereby the dies 16 on the conduction channels 14a, 14b, 14c and 14d are electrically connected in series. The first metal members 22 are arranged on positions of the conduction metal blocks 18 uncovered by the photoresist layers 20. A plurality of second metal members 24 is arranged on the first metal members 22 formed on the conduction metal blocks 18, and the second metal members 24 and the first metal members 22 respectively arranged over the conduction metal blocks 18 and the dies 16 are located on an identical plane.

Continuing from the abovementioned paragraph, the metal film 162, the first metal member 22 and the second metal member 24 comprise Ti, Au or a combination of these in the embodiment, but the present invention is not limited thereto. The first metal members 22 cascaded to the dies 16 belong to n-metal of the LED display 10, and the first metal members 22 formed on the conduction metal blocks 18 and combined with the second metal members 24 belong to p-metal of the LED display 10. The conduction channels 14a-14d comprise metal oxide, two dimension conduction material or a combination of these. The embodiment exemplifies metal oxide, but the present invention is not limited thereto. The photoresist layer 20 is a transparent photoresist, and the substrate 12 is a substrate that a visible light penetrates, such as a sapphire substrate, but the present invention is not limited thereto. The substrate 12 is alternatively a glass substrate. The present invention does limit the size, size and amount of the abovementioned elements.

Figure 3:
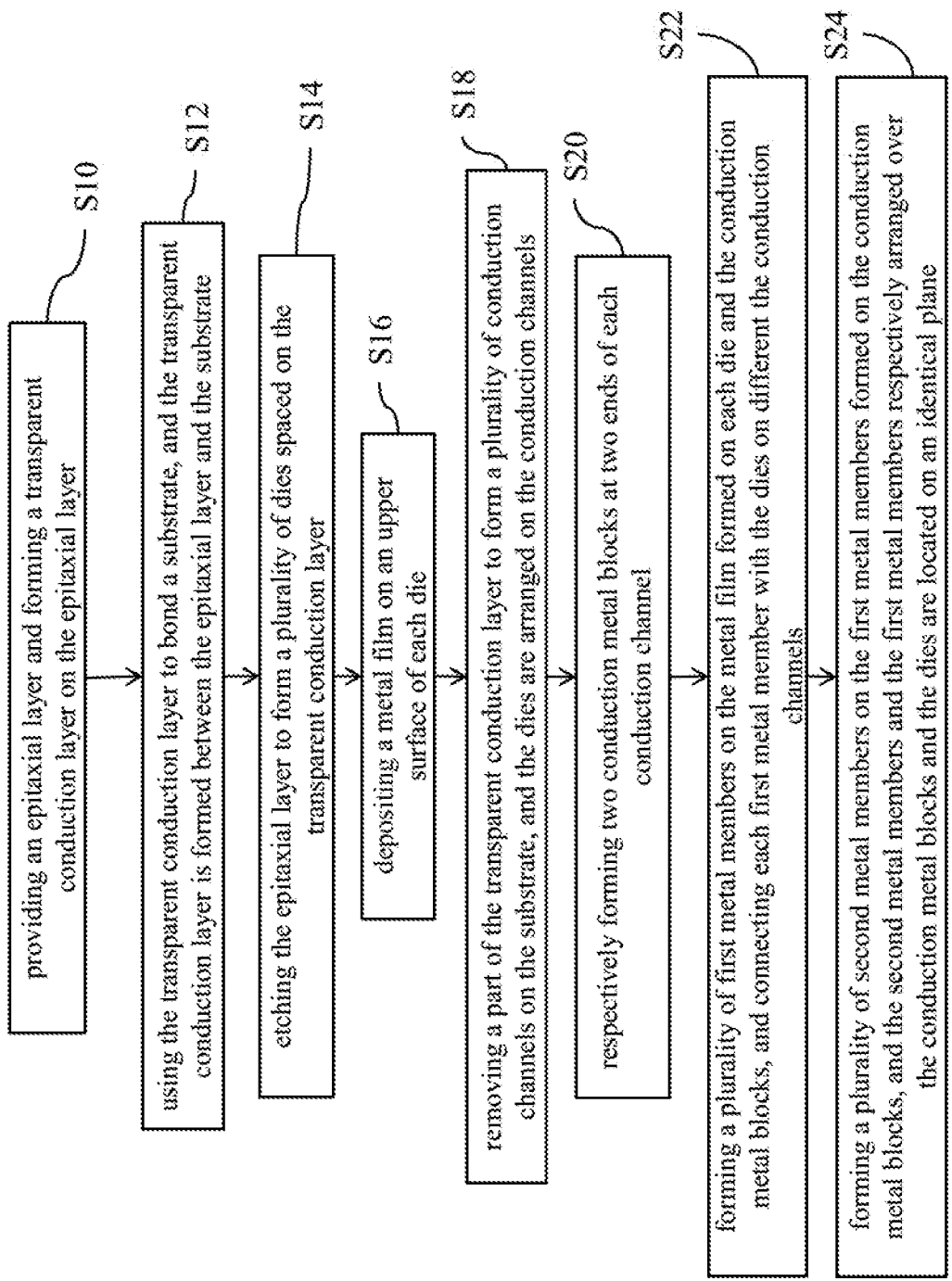
FIG. 3 is a flowchart showing a method for fabricating a LED display according to an embodiment of the present invention.
Figure 4B:
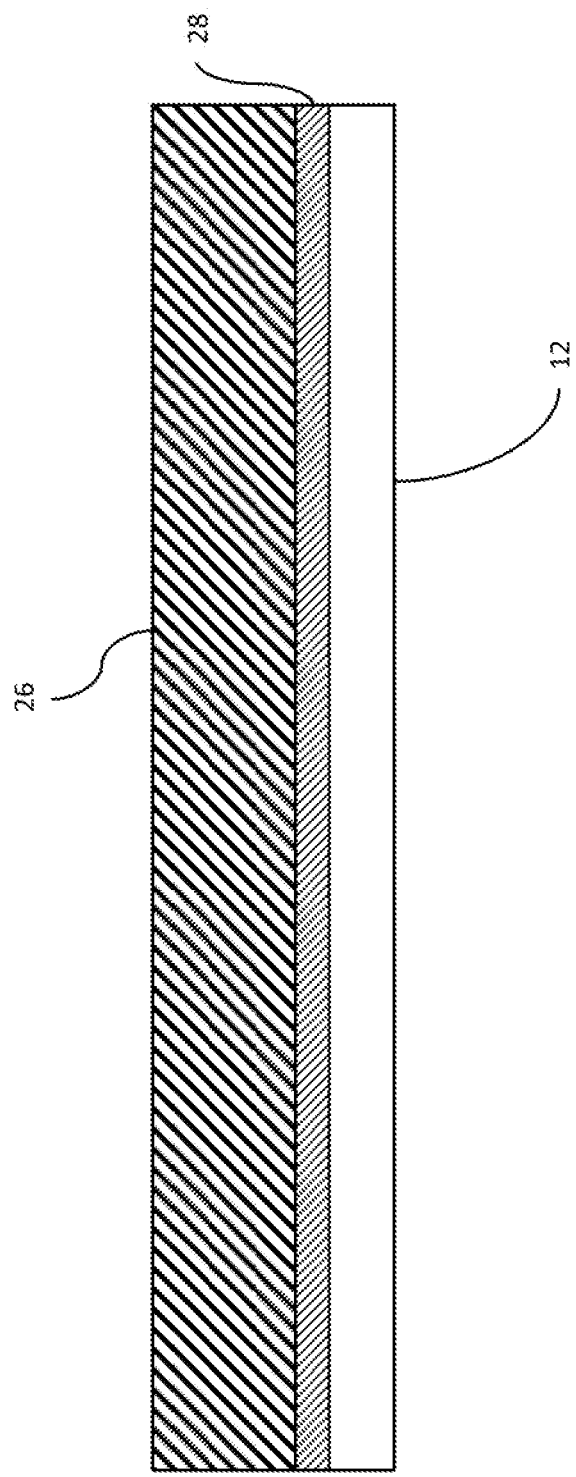
Figure 4C:
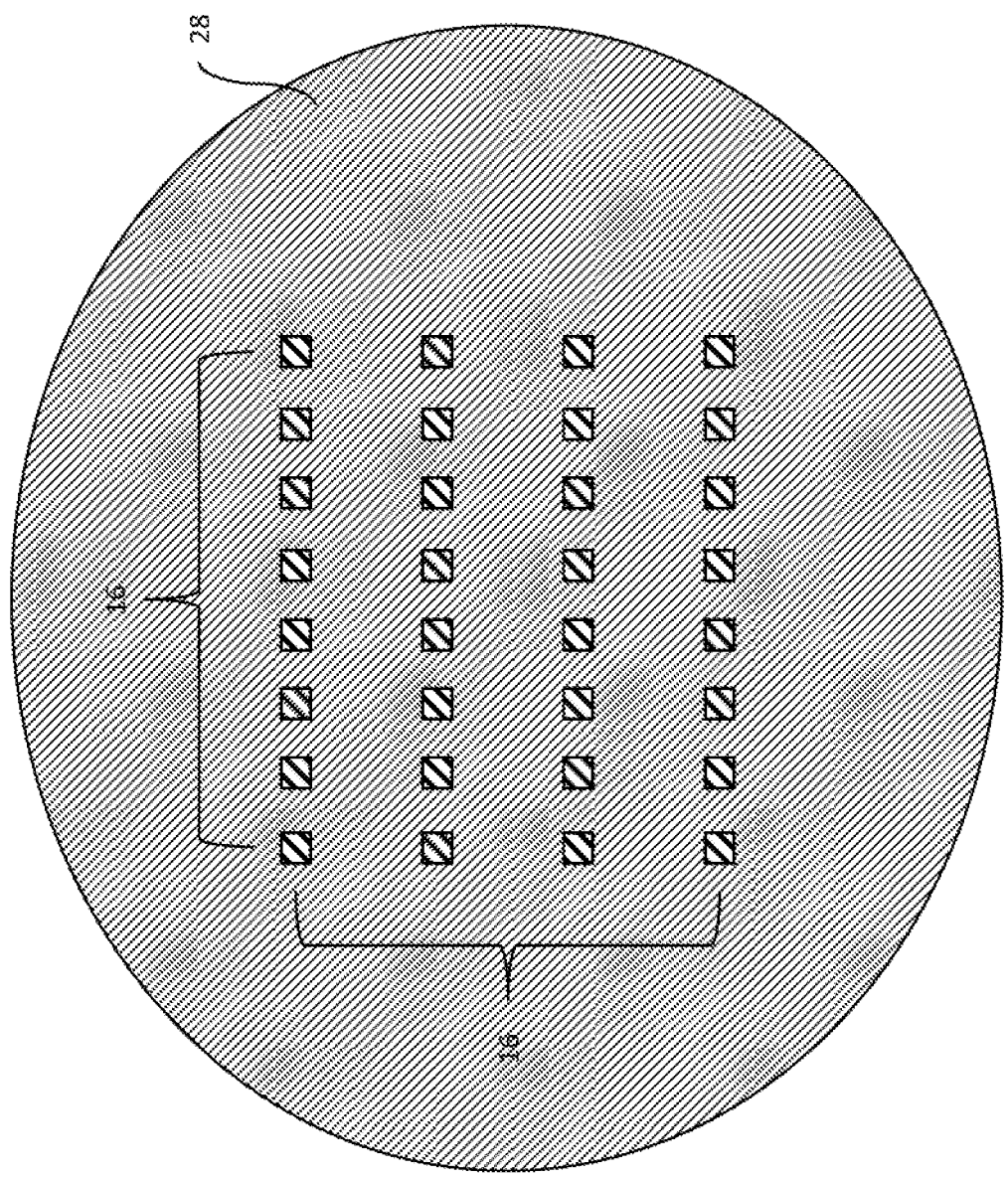
Figure 4D:
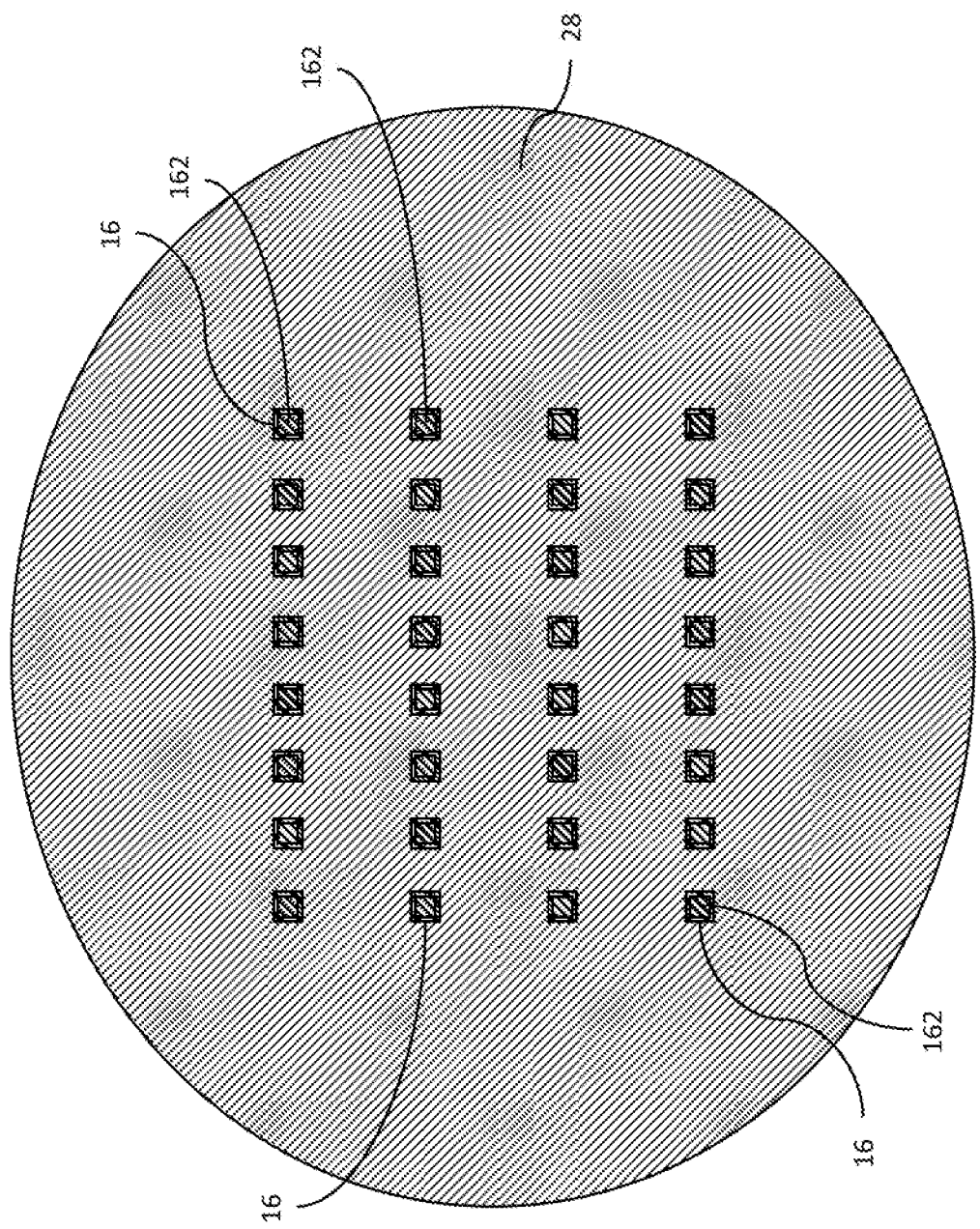
Figure 4F:
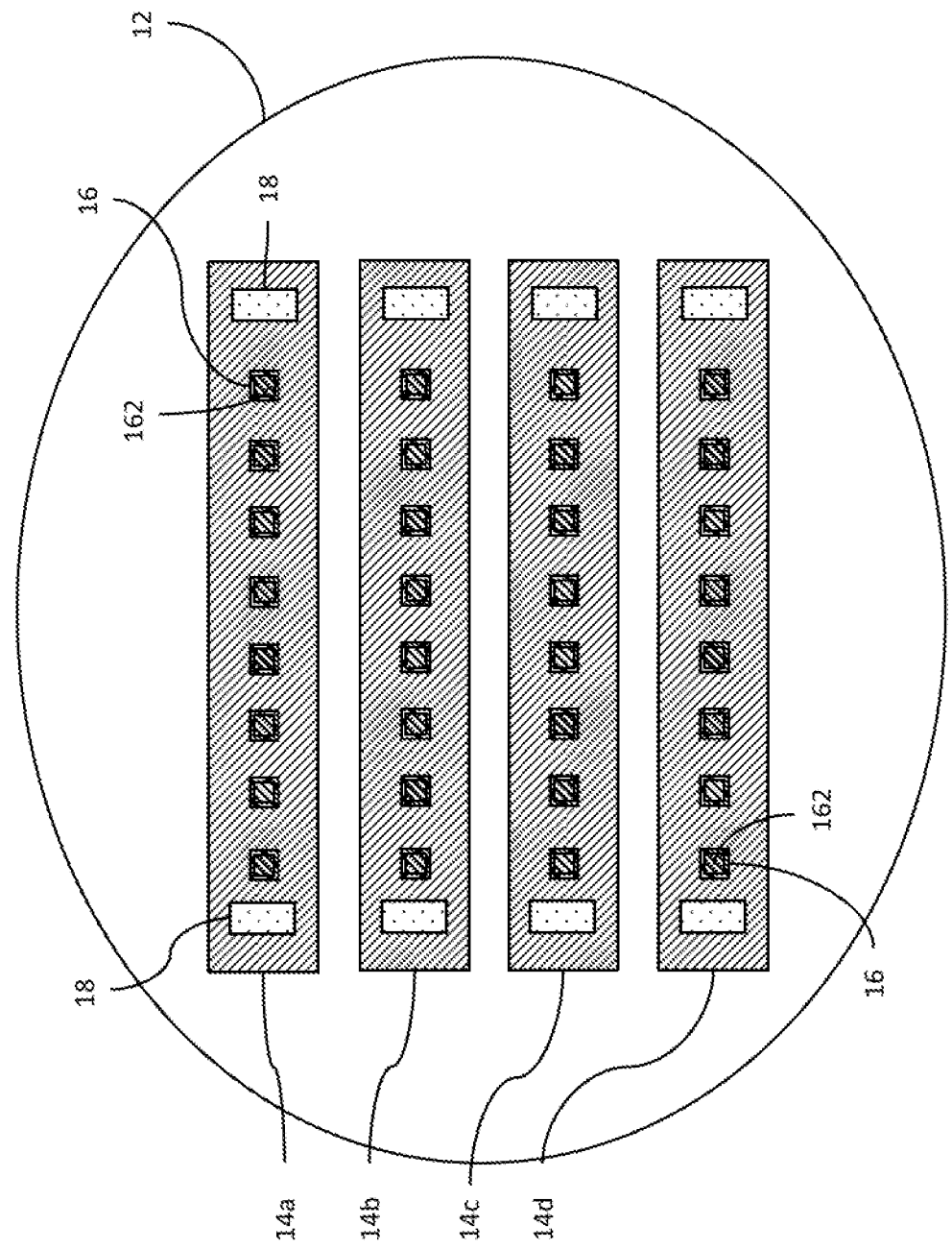

After describing the electrodeless LED display, the method for fabricating the electrodeless LED display is described. Refer to FIG. 3. Firstly, in Step S10 and FIG. 4a, an epitaxial layer 26 is provided and a transparent conduction layer 28 is formed on the epitaxial layer 26. In the embodiment, the transparent conduction layer 28 is formed on the epitaxial layer 26 via a deposition method, such as an electron-beam evaporation method, but the present invention is not limited thereto. In Step S12 and FIG. 4b, the transparent conduction layer 28 is used to bond a substrate 12, and the transparent conduction layer 28 is formed between the epitaxial layer 26 and the substrate 12. In the embodiment, the transparent conduction layer 28 is bonded to the permanent substrate 12 through glue. After, the substrate for the epitaxial layer 26 was removed, the epitaxial layer 26 exposured on the permanent substrate 12. Starting from FIG. 4c, figures are top views. In Step S14 and FIG. 4c, the epitaxial layer 26 of FIG. 4b is etched to form a plurality of dies 16 spaced on the transparent conduction layer 28. In the embodiment, the epitaxial layer 26 is etched by mesa etching. In Step S16 and FIG. 4d, an upper surface of each of the dies 16 spaced is plated with a metal film 162. An area of the metal film 162 on the die 16 is less than an area of the upper surface of the die 16. In Step S18 and FIG. 4e, a part of the transparent conduction layer 28 is removed to form a plurality of conduction channels 14a, 14b, 14c and 14d on the substrate 12. The plurality of dies 16 is arranged on the conduction channels 14a, 14b, 14c and 14d. In the embodiment, a part of the transparent conduction layer 28 is removed by hydrochloric acid, so as to form a plurality of conduction channels 14a, 14b, 14c and 14d. In Step S20 and FIG. 4f, two conduction metal blocks 18 are respectively formed at two ends of each conduction channel 14a-14d. In the embodiment, two conduction metal blocks 18 are respectively formed at two ends of the conduction channel 14a, 14b, 14c and 14d.

Figure 4G:
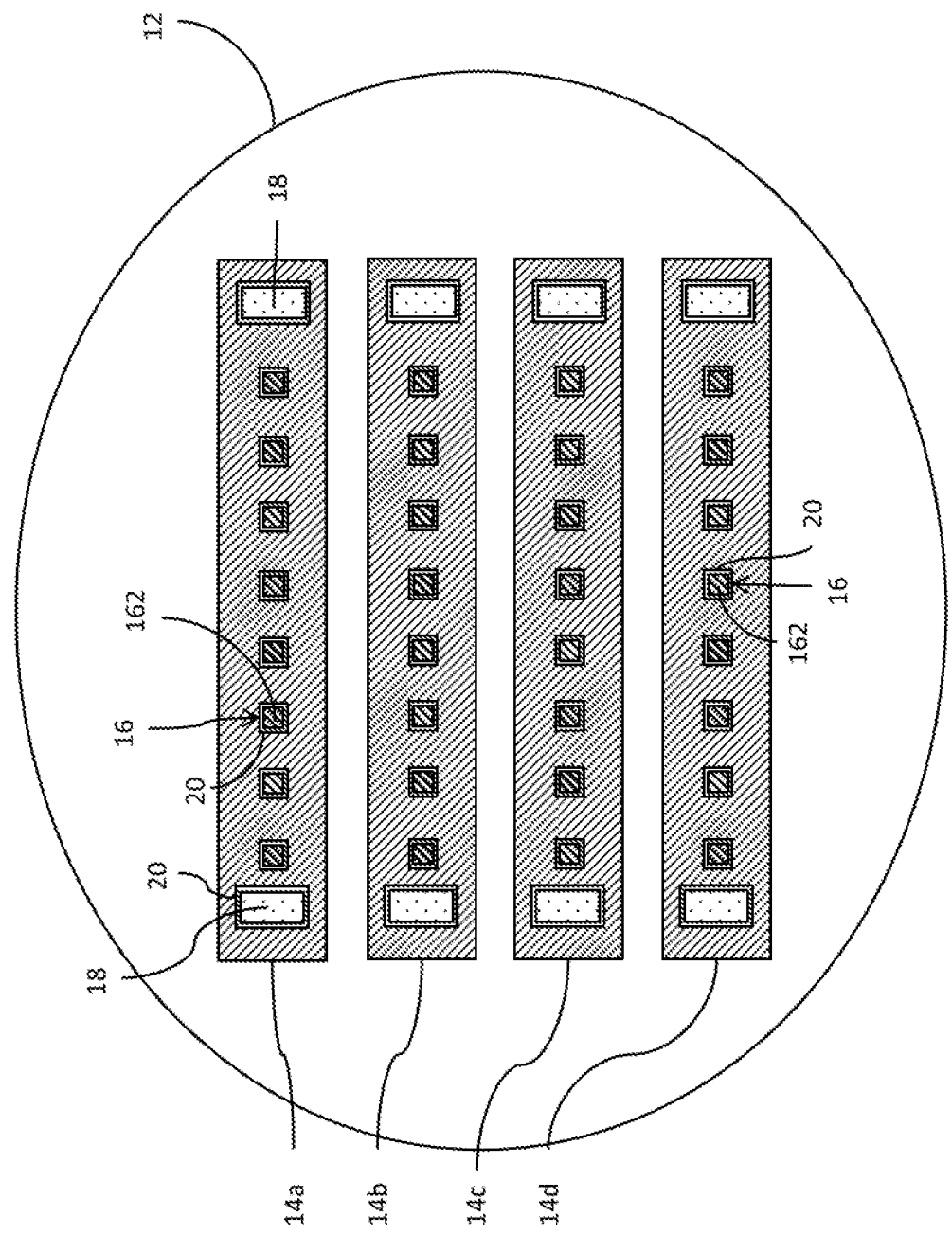
Figure 4H:
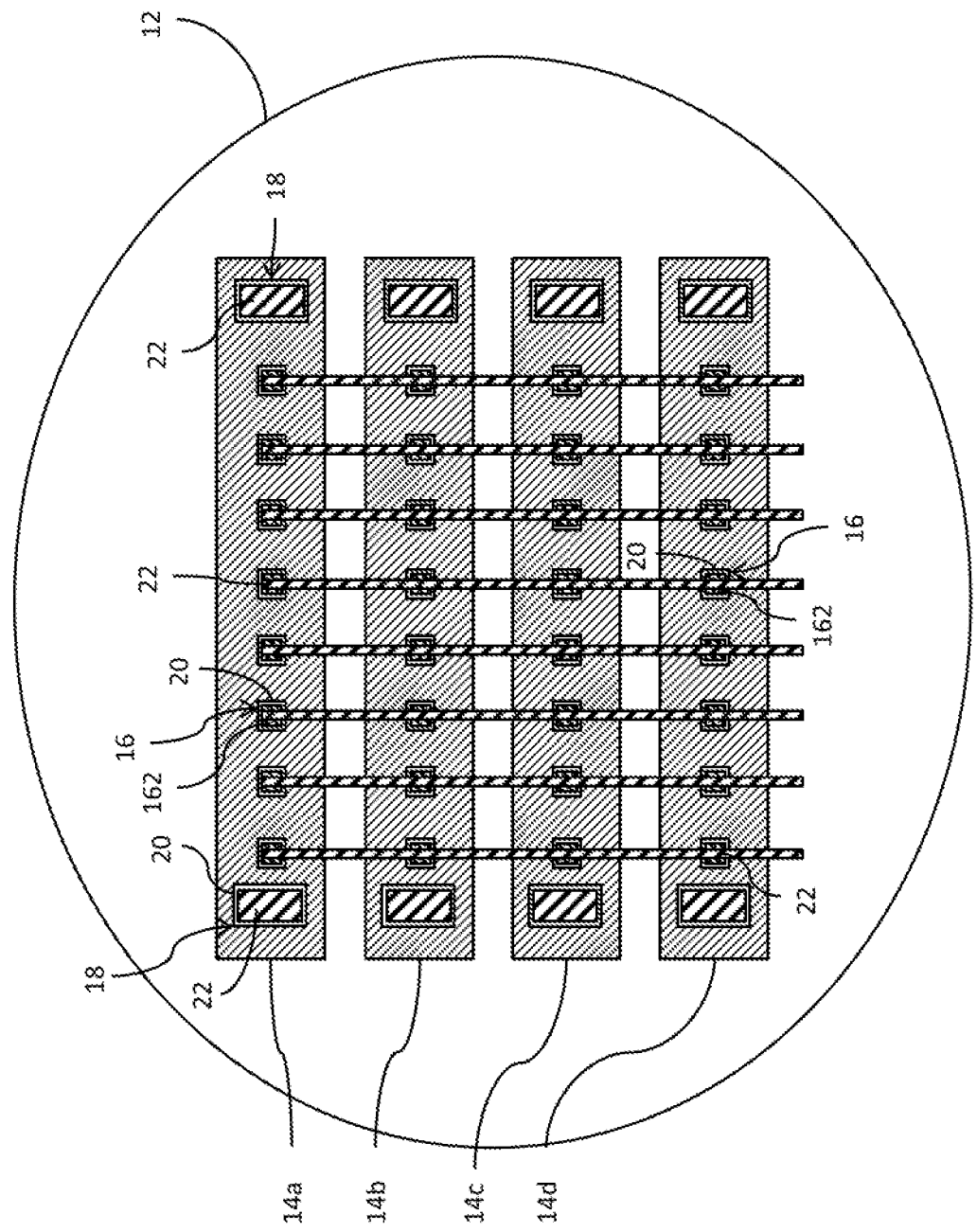
Figure 4I:
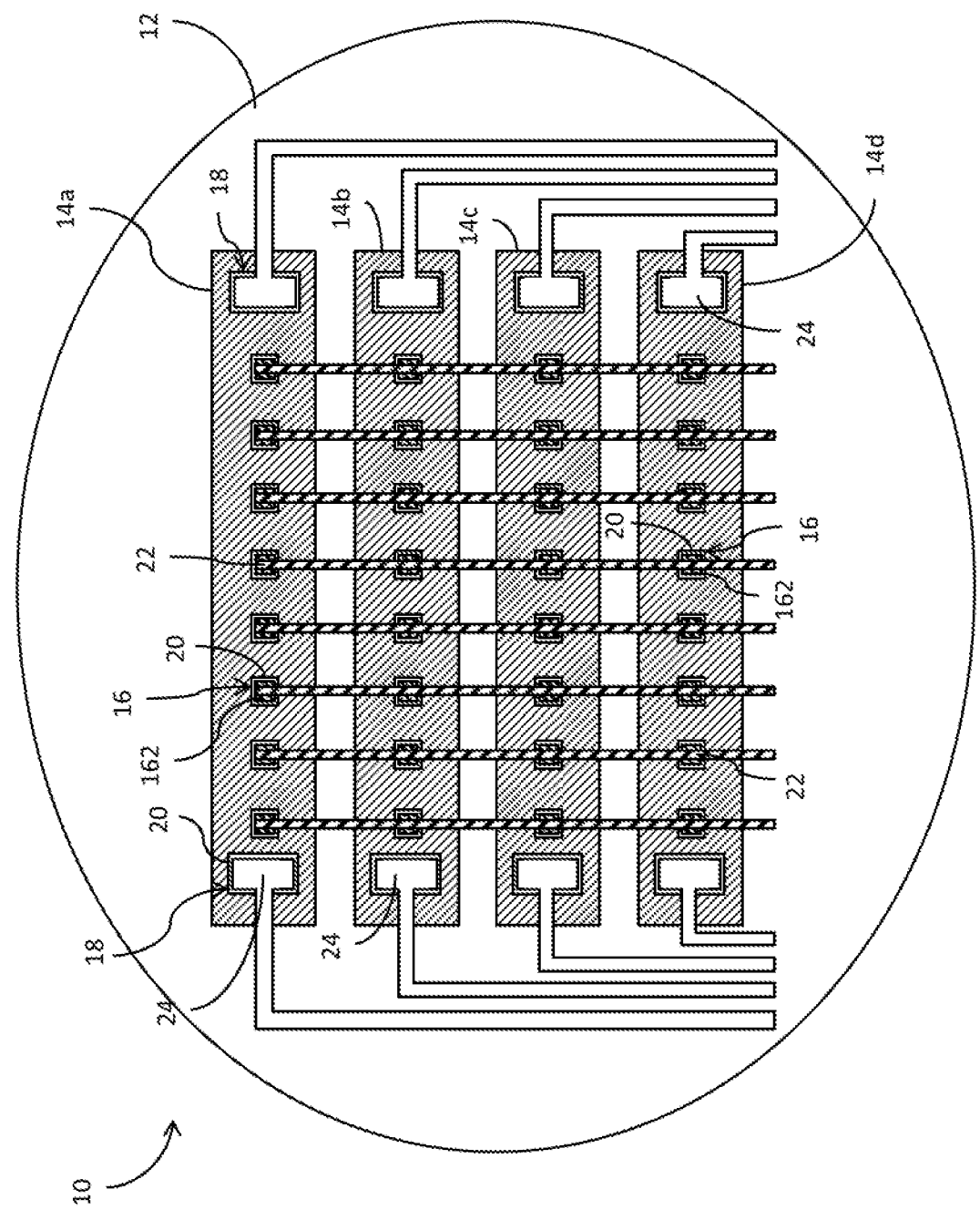

Continuing from the above mentioned paragraph, in Step S22, FIG. 4g and FIG. 4h, the dies 16 and the conduction metal blocks 18 are coated with photoresists, exposed by photomasks and developed to remove photoresists, so as to expose the metal film 162 formed on each die 16 and a part of upper surfaces of the conduction metal blocks 18. A photoresist layer 20 is formed on a periphery of each of the die 16 and the conduction metal block 18. The photoresist layer 20 is not removed after development, so as to protect and fix the die 16 and the conduction metal block 18. Then, a first patterned photoresist layer (no shown) is formed on the dies 16 and the conduction metal blocks 18, and the lithography and etching processes are performed on the first patterned photoresist layer for the first time. A plurality of first metal members 22 is formed on the metal films 162 formed on the dies 16 and the conduction metal blocks 18 with the first patterned photoresist layer being a mask. The first metal members 22 are connected with the dies 16 on the different conduction channels 14a, 14b, 14c and 14d. In Step S24, FIG. 4i and FIG. 2, a second patterned photoresist layer is formed on the conduction metal blocks 18 (not shown), and the lithography and etching processes are performed on the second patterned photoresist layer for the second time. A plurality of second metal members 24 is formed on the first metal members 22 formed on the conduction metal blocks 18 with the second patterned photoresist layer being a mask, whereby the second metal members 24 and the first metal members 22 respectively arranged over the conduction metal blocks 18 and the dies 16 are located on an identical plane.

The method for fabricating the electrodeless LED display of the present invention directly depositing the transparent conduction layer on the epitaxial layer, directly transfers them to the permanent substrate to perform an etching process, etches the transparent conduction layer to define elements and conduction wires, uses the etched transparent conduction layer as conduction wires, forms the plurality of dies on the transparent conduction layer, uses the photoresist made of thermosetting polymer to perform the insulation process, and then uses the lithography and etching process to define electrode regions and plate electrodes, thereby completing the fabrication process. The LED display of the present invention has advantages of high resolution, high brightness, and high contrast. Besides, the LED display can resist a bad environment and have a light-emitting surface that no light shields. As a result, the LED display of the present invention is more competitive than a convention LED display when applying to various instruments.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An electrodeless LED display comprising:
   a substrate;
   a plurality of conduction channels spaced on said substrate;
   a plurality of dies spaced on each said conduction channel;
   a plurality of conduction metal blocks, and every two said conduction metal blocks arranged at two ends of each said conduction channel;
   a plurality of first metal members perpendicular to said conduction channels, and said first metal members arranged on said conduction metal blocks and said dies, and said dies are electrically connected in series through said first metal members; and
   a plurality of second metal members arranged on said first metal members formed on said conduction metal blocks, and said second metal members and said first metal members respectively arranged over said conduction metal blocks and said dies are located on an identical plane.

2. The electrodeless LED display according to claim 1, wherein each of said dies is further provided with a metal film arranged on an upper surface of said die.

3. The electrodeless LED display according to claim 2, wherein each of said die and said conduction metal block is further provided with a photoresist layer covering a periphery of each of said die and said conduction metal block and uncovering said metal film arranged on said die and a part of an upper surface of said conduction metal block.

4. The electrodeless LED display according to claim 2, wherein said metal film, said first metal member and said second metal member comprise Ti, Au or a combination of these.

5. The electrodeless LED display according to claim 1, wherein said conduction channel comprises metal oxide, two dimension conduction material or a combination of these.

6. The electrodeless LED display according to claim 1, wherein said substrate is a substrate that a visible light penetrates.

* * * * *